United States Patent [19]
Loh et al.

[11] Patent Number: 5,447,799
[45] Date of Patent: Sep. 5, 1995

[54] POLYMERIZATION PROCESS

[75] Inventors: Ih-Houng Loh, Maynard; David M. Hudson, Chelmsford, both of Mass.

[73] Assignee: Advanced Surface Technology, Inc., Billerica, Mass.

[21] Appl. No.: 324,677

[22] Filed: Oct. 18, 1994

Related U.S. Application Data

[62] Division of Ser. No. 990,683, Dec. 15, 1992, Pat. No. 5,355,832.

[51] Int. Cl.6 ............................................. B32B 9/04
[52] U.S. Cl. .................... 428/448; 427/255.6; 427/407.1; 427/489; 427/578
[58] Field of Search ............... 427/489, 578, 255.6, 427/407.1; 428/448

[56]  References Cited
U.S. PATENT DOCUMENTS

| | | | |
|---|---|---|---|
| 4,072,769 | 2/1978 | Lidel | 427/38 |
| 4,366,184 | 12/1982 | Auerbach et al. | 427/41 |
| 4,618,507 | 10/1986 | Sadhir | 427/41 |
| 4,673,589 | 6/1987 | Standley | 427/41 |
| 4,683,143 | 7/1987 | Riley | 427/8 |
| 4,692,347 | 9/1987 | Yasuda | 427/40 |
| 4,810,524 | 3/1989 | Nakayama et al. | 427/38 |
| 4,921,723 | 5/1990 | Nichols et al. | 427/41 |

OTHER PUBLICATIONS

Sharma et al., Effect of glow discharge treatment of substrates on parylene–substrate adhesion, J. Vac. Sci. Technol., 21(4), Nov./Dec. 1982, pp. 994–997.

Technical Data Sheet (No. 781OBS, APSB–Series Plasma System) and a blue print (advertising materials received in Apr. 1988, from Advance Plasma Systems, Inc. St. Petersburg, Fla.

Sadhir et al., The adhesion of glow-discharge polymers, Silastic and Parylene to implantable platinum electrodes: results of tensile pull tests after exposure to isotonic sodium chloride, Biomaterials 1981 vol. 2 Oct., pp. 239–243. (No month available).

Riley et al., Investigation into the Effect of Plasma Pretreatment on the Adhesion of Parylene to Various Substrates, Cleveland Electrical/Electronic Conference, May 20–22, 1980, pp. 93–99.

Loh et al., Plasma Enhanced Parylene Deposition, ANTEC (1991), pp. 1099–1103. (No month available).

*Primary Examiner*—Bernard Pianalto
*Attorney, Agent, or Firm*—Fish & Richardson

[57]  ABSTRACT

A process of depositing polymeric materials on the surface of a substrate.

14 Claims, 1 Drawing Sheet

POLYMERIZATION PROCESS

STATEMENT AS TO FEDERALLY SPONSORED RESEARCH

This invention was made with support from National Institutes of Health (Grant No. 1 R43 ND30274-01) and National Science Foundation (Grant No. ISI-9022393). Accordingly, the U.S. Government has certain rights in the invention.

This is a divisional of application Ser. No. 07/990,683, filed Dec. 15, 1992 U.S. Pat. No. 5,355,832.

FIELD OF THE INVENTION

This invention relates to bonding of a polymeric material to a substrate. More particularly, it relates to formation of a polymeric material from vaporizable monomers on the surface of a substrate in a low pressure chamber.

BACKGROUND OF THE INVENTION

Poly-p-xylylene polymer ("PPX") coatings are useful in many applications for providing electrical insulation and moisture barriers. Because they are applied in a vapor deposition polymerization process, the coatings can be thin and extremely uniform in coverage. The ability of the polymer molecules to form void-free films on the substrates in the polymerization chamber is the key factor in the excellent encapsulation qualities of the polymer.

Unfortunately, the PPX coatings are unable to form chemical bonds with the surfaces of the substrates. Wet chemical coupling agents are commonly used in the industry to provide a-measure of adhesion. However, their use has raised environmental concerns.

The preparation of polymer surfaces before application of PPX by gas plasma cleaning or activation is well known. Many PPX coating facilities routinely employ gas plasma to clean the substrate surfaces prior to PPX coating. A few have demonstrated the ability to create a gas plasma within the PPX polymerization chamber itself, thereby forming a high concentration of radicals on the surfaces to be coated. Since the vacuum chamber need not be opened to air between the plasma and the PPX processes, the lifetime of these surface radicals is relatively long, and the PPX molecules have an opportunity to form chemical bonds to the substrate surface. This type of surface preparation, although useful for substrates made of polymeric materials, is not very effective when applied to direct PPX coating of metals or other inorganic surfaces such as ceramics or semiconductors.

The use of glow discharge polymer ("GDP" or plasma polymer) as insulative coatings and as primary layers for the subsequent application of PPX is well documented in the literature. It has been demonstrated that use of GDP, specifically of methane, as "primer" coatings on metals to improve the adhesion of the PPX to the substrates. The adhesion improvement and concomitant increased moisture resistance is due to the creation of a highly crosslinked, hydrophobic film via GDP. Several monomer gases were proven to be effective, notably methane, ethane, propane, ethylene, and propylene.

However, few reports, if any, hitherto have addressed the issue regarding the practical use of GDP as a primary layer prior to PPX coating. As a matter of fact, most of the previously described processes exhibit distinct drawbacks which would render them unusable in an industrial process.

SUMMARY OF THE INVENTION

An aspect of the present invention relates to an apparatus for depositing one or more polymeric materials on the surface of a substrate.

The apparatus includes a polymerization chamber; an inlet for admitting a glow discharge polymerization precursor into the polymerization chamber; a first conductive member extending into the polymerization chamber; a first conductive support attached to and sustained by the first conductive member for holding a substrate; a power source arranged for providing electrical energy to the first conductive member; a second conductive member on or within the polymerization chamber, the second conductive member being spaced and insulated from the first conductive member; and a pump arranged for applying a vacuum to the polymerization chamber. Consequently, a glow discharge zone is established within the polymerization chamber when a vacuum is applied thereto and electrical energy from the first conductive member is received by the second conductive member. The terms "conductive" and "insulated" refer to the capability of transmitting electrical energy.

One preferred embodiment of the above-described apparatus is one which further includes a first housing outside the polymerization chamber for sublimation of a vapor deposition polymerization precursor therein; and a second housing for pyrolysis of a sublimed vapor deposition polymerization precursor, the second housing having an inlet in communication with the first housing and an outlet in communication with the polymerization chamber.

Preferably, the first conductive member is defined by a tube in communication with both the inlet and the polymerization chamber. It is also preferred that the apparatus further include one or more additional supports attached to the first conductive member and parallel with the first support, with at least one of the supports being insulated from the first conductive member and thereby forming the second conductive member and at least another of the supports being electrically connected to the first conductive member.

Note that the terms "attached" and "sustained by", which are used to describe the relationship between the first conductive member and the conductive support, do not mean that the two parts are only in direct contact and are only affixed to each other in a rigid manner. As will be more clearly shown below, when the support is a round shelf, it can be sustained indirectly by the first conductive member via a hub. Furthermore, it is preferred that the first conductive member be rotatable around its longitudinal axis, or the support be rotatable around the longitudinal axis of the first conductive member, or both.

Electrical energy used for the apparatus of this invention can be provided from a radio frequency power source, a microwave power source, an audio frequency power source, a direct current power source, or an alternating current power source.

Another aspect of the present invention relates to a process for depositing polymeric materials on the surface of a substrate. The process includes the steps of: (1) providing a first polymeric material on the surface of the substrate by glow discharge polymerization of either a mixture of silane and a vaporizable hydrocarbon monomer or a vaporizable organosilane monomer which contains at least one carbon atom and no oxygen atom; and (2) providing a second polymeric material over the first polymeric material by vapor deposition polymerization of an aromatic hydrocarbon, a substituted aromatic hydrocarbon, an unsaturated hydrocarbon, or a substituted unsaturated hydrocarbon. Aromatic hydrocarbons include compounds with one or more benzene rings (e.g., benzene, toluene, xylene, naphthylene and anthracene), as well as heterocyclic compounds (e.g., pyridine, quinoline, furan and indole).

It is preferred that the above-described process further include, before step (1), the step of glow discharge activating the surface of the substrate with oxygen or an oxygen-rich molecule selected from the group consisting of $CO_2$, $NO_2$, $CO$, $NO_2$, $N_2O$, $NO$, $SO_3$ and $SO_2$. It is also a preferred process that in step (1) the crosslinking density of the first polymeric material is controlled by varying input power or monomer pressure of the glow discharge polymerization.

Preferably, the first polymeric material is provided by glow discharge polymerization of a vaporizable organosilane monomer which contains at least one carbon atom and no oxygen atom. Note that the term "organosilane monomer" refers to both silane-based organic compounds and substituted silane-based organic compounds.

Examples of "vaporizable an organosilane monomer" which can be used in the above process include, but are not limited to, the following: trimethylsilane, tetramethylsilane, diethylsilane, dimethylchlorosilane, dimethylsilane, ethyldimethylsilane, vinyltrimethylsilane, butyldimethylsilane, chloromethyldimethylsilane, diethylmethylsilane, N,N-dimethylaminotrimethylsilane, divinyldimethylsilane, allyldimethylsilane, allytrimethylsilane, amyldichlorosilane, amylmethyldichlorosilane, amyltrichlorosilane, bis(dimethylamino)dimethylsilane, bis(dimethylamino)methylsilane, butylaminotrimethylsilane, butyldimethylaminosilane, chloromethyldimethylvinylsilane, chloromethyltrimethylsilane, dimethyldichlorosilane, dimethyldifluorosilane, ethyldichlorosilane, ethylmethyldichlorosilane, ethylsilane, hexamethyldisilane, N-hexysilane, methylsilane, N-octylsilane, tetraethylsilane, triethylsilane, trimethylchlorosilane, trimethyldisilane, trimethylfluorosilane, trivinylmethylsilane, vinyldiethylmethylsilane, vinyldimethylchlorosilane, and vinyltrichlorosilane. Trimethylsilane and tetramethylsilane are particularly preferred. Also preferred are diethylsilane, dimethylchlorosilane, dimethylsilane, ethyldimethylsilane, vinyltrimethylsilane, butyldimethylsilane, chloromethyldimethylsilane, diethylmethylsilane, N,N-dimethylaminotrimethylsilane, and divinyldimethylsilane are preferred.

Examples of "vaporizable hydrocarbon monomer" include, but are not limited to, methane, ethane, propane, ethylene and propylene.

Preferably, the aromatic hydrocarbon or substituted aromatic hydrocarbon used in step (2) is p-xylylene or a substituted p-xylylene. Both p-xylylene and substituted pxylylenes are monomer of the well-known parylene dimers. For more discussion on parylenes, see "Description of the Preferred Embodiments" below. When an unsaturated hydrocarbon or a substituted unsaturated hydrocarbon is used in this step, acetylenic hydrocarbons are preferred.

Also within the present invention is a substrate coated with a composition by the above-described process(es). In other words, the composition includes a first polymeric material on the substrate and a second polymeric material on the first polymeric material. The first polymeric material is produced by glow discharge polymerization of either a mixture of silane and a vaporizable hydrocarbon monomer or a vaporizable organosilane monomer which contains at least one carbon atom and no oxygen atom. The second polymeric material, on the other hand, is produced by vapor deposition polymerization of an aromatic hydrocarbon, a substituted aromatic hydrocarbon, an unsaturated hydrocarbon, or a substituted unsaturated hydrocarbon.

Other features and advantages of the invention will be apparent from the following description of the preferred embodiments thereof, and from the claims.

BRIEF DESCRIPTION OF THE DRAWING

The drawing will first be described.

The Figure is a schematic drawing illustrating a preferred apparatus of the present invention.

Figure 1:
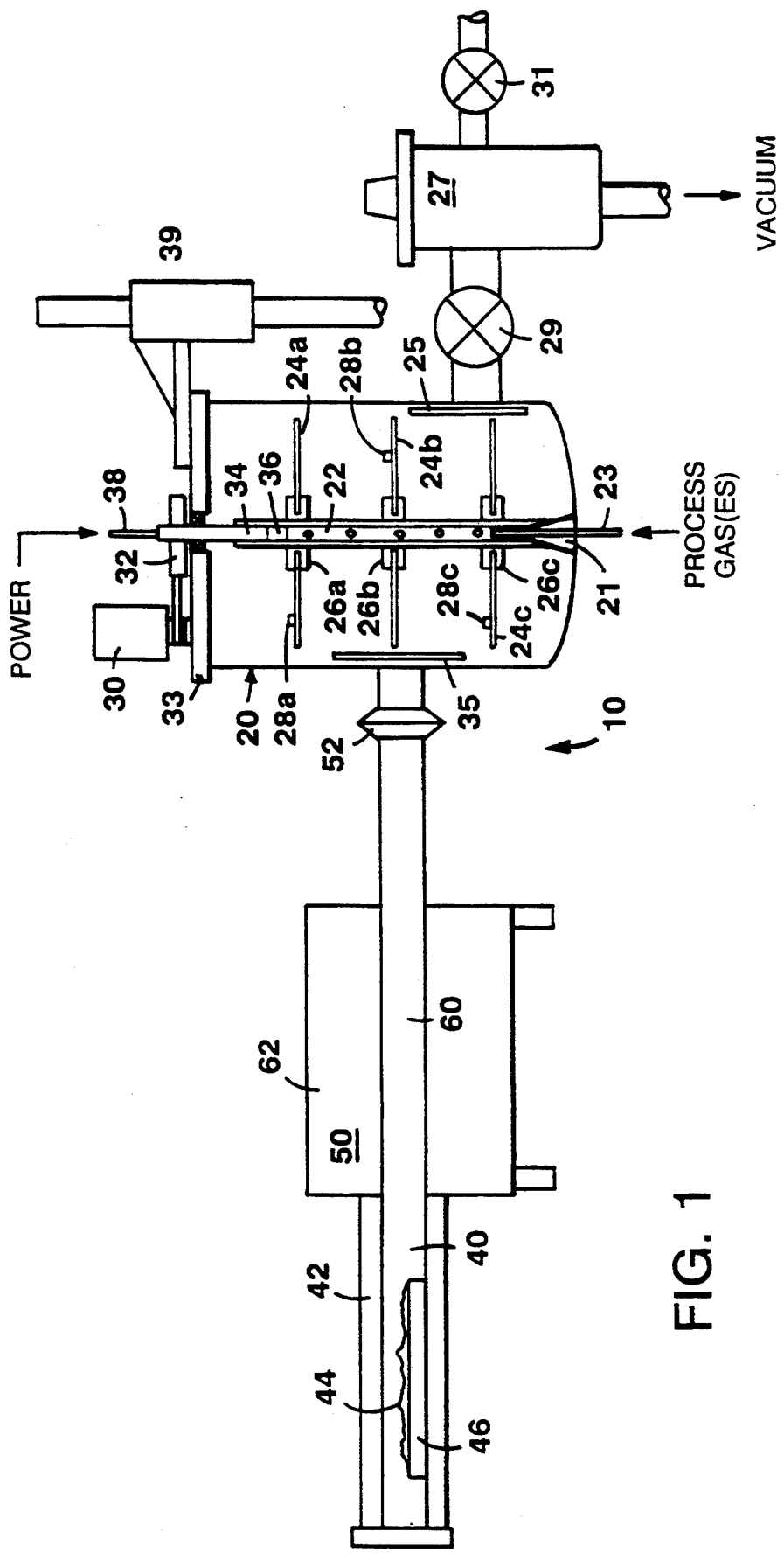

Note that various elements shown in the drawing are not necessarily in proportion to their actual sizes.

DESCRIPTION OF THE PREFERRED EMBODIMENTS

Apparatus

Illustrated in the Figure is a preferred apparatus of the invention, generally designated by the numeral 10. This apparatus 10 includes a polymerization chamber 20, a sublimation housing 40 and a pyrolysis housing 60, all of which are in communication with each other in a manner shown in the Figure. More specifically, a single tube 50, which provides both the sublimation housing 40 and the pyrolysis housing 60, is connected to the polymerization chamber 20 via a ball joint 52. The sublimation housing 40 and the pyrolysis housing 60 are both covered by heaters 42 and 62, respectively. The sublimation heater 42, which is removable, provides the thermal energy required to sublimate a vapor deposition polymerization precursor 44 placed in a boat 46 within the sublimation housing 40. The pyrolysis heater 62, on the other hand, provides the heat required for pyrolysis of the sublimed precursor 44 when it passes therethrough before entering into the polymerization chamber 20.

The polymerization chamber 20 contains a vertically disposed gas diffuser tube 22 for receiving a plasma process gas or gases from an inlet tube 23. Gas flow is usually controlled by a precision instrument such as a mass flow controller (not shown). The diffuser tube 22, which is perforated and rotatable, acts to distribute the gas or gases evenly into the polymerization chamber 20. Three shelves 24a, 24b and 24c, which are made of conductive material, are affixed to the diffuser tube 22 via three hubs 26a, 26b and 26c, respectively. Thus, the diffuser tube 22 also acts as the rotating axle of the shelves 24a, 24b and 24c. Substrates 28a, 28b and 28c to be coated are placed on the shelves 24a, 24b and 24c. The shelves 24a, 24b and 24c are preferably perforated to allow for good gas flow in all parts of the polymerization chamber 20. If required, substrates can be suspended from the shelves in order to expose the maximum amount of area to the coating gases.

The entire shelf and gas diffuser tube assembly is rotated by means of a motor 30 driving a non-conductive belt around a pulley 32 which is connected to a spline 34, the spline 34 meshing with a matching hole in the gas diffuser tube 22. All of the diffuser tube 22, the pulley 32 and the spline 34 are made of conducting materials. The gas diffuser tube 22 is connected to a radio frequency ("RF") power source (not shown) for generation of a glow discharge zone within the polymerization chamber 10. At the bottom of the spline hole, a spring 36 made of an electrically conductive material ensures good contact and transfer of the RF energy from the spline 32 to the gas diffuser tube 22. Note that an external conductor 38 provides a means to couple the RF energy to the rotating diffuser tube 22 within the polymerization chamber 20.

In the Figure apparatus, while the hubs 26a and 26c are made of an insulative material, the hub 26b is made of a conducting material. By contrast, the shelves 24a, 24b and 24c are all made of a conductive material. As a result, the RF energy is transferred via the diffuser tube 22 to the shelves 24a and 24c. Generally, the electrical energy is coupled from the gas diffuser tube 22 to one or more of the shelves via the shelf hubs, which can be made from either conducting or insulating materials, as required. In this way, the shelf or shelves act as capacitive electrodes within the polymerization chamber.

Both halves of the tapered bearing 21 are made from an insulating material with suitable lubricity, such as polytetrafluoroethylene, so that the entire shelf and gas diffuser tube assembly is self-centering within the chamber 20, is insulated from the chamber 20 electrically, is allowed to rotate freely, and allows the passage of process gas or gases through its center.

The polymerization chamber 20 is preferably made of stainless steel or other electrically conducting material to provide a uniform ground path for the RF energy. The chamber lid 33 is both removed and installed by use of a hoist mechanism 39.

Also provided in the polymerization chamber 20 are copper baffles 25 and 35, which act to contain the plasma zone within the polymerization chamber 20 and to slow the flow of the process gas or gases.

A cold trap 27 acts to remove any unpolymerized monomer by condensation on its interior surfaces, while the valve 29 provides a means of isolating the cold trap 27 so that the polymerization chamber 20 can be opened to atmosphere without exposing the interior walls of the cold trap 27 to air, thus preventing water condensation which would adversely affect the quality of the vacuum produced. Finally, a vent valve 31 allows for removal of the cold trap liner for periodic cleaning.

Without further elaboration, it is believed that one skilled in the art can, using the description herein, utilize the present invention to its fullest extent. The FIG. 1 apparatus is, therefore, to be construed as merely illustrative, and not limitative of the remainder of the disclosure in any way whatsoever.

Thus, a polymerization chamber, identical or similar to that described above, is by itself also regarded as an embodiment of the present invention.

Furthermore, power sources other than RF, such as an audio frequency power source, a direct current power source, an alternating current power source or a microwave source, can also be used to provide electrical energy and thereby establish a glow discharge zone when the energy is received by a conductive means (e.g., a copper plate or a shelf, see discussion infra). Use of electrical energy from various power sources for glow discharge polymerization is well known in the art. See, e.g., Boenig *Fundamentals of Plasma Chemistry and Technology*, Chap. VIII, 1.6, Technomic Publishing Co., Inc., Lancaster, Penna., (1988); *Plasma Deposition, Treatment, and Etching of Polymers*. pp. 1–84, Ed. d'Agostino, Academic Press, New York, N.Y., (1990); Wertheimer et al. *Advances in Basic and Applied Aspects of Microwave Plasma Polymerization*, presented at the Sixth International Symposium on Plasma Chemistry, Montreal, Quebec, Canada, Jul. 24–28, 1983, all of which are hereby incorporated by reference.

In addition, while the apparatus depicted in FIG. 1 has a rotatable diffuser tube, other embodiments having a fixed diffuser and a rotatable shelves or having a fixed diffuser and fixed shelves are also within the invention. Furthermore, one or more than three shelves can be attached to the diffuser tube. Similarly, the polymerization chamber and the shelves can be made of either insulating or conducting materials. However, under all circumstances, at least one shelf must be made of a conductive material to receive electrical energy from the power source. Preferably, all shelves are made of a conducting material so that each and every of them can be used as electrodes, either to transmit or to receive electrical energy.

When a polymerization chamber is made of an insulating material, e.g., glass, and has only one shelf in it, one or more copper plates may be placed on the inner or outer wall of the polymerization chamber as to receive electrical energy transmitted from the shelf, thereby establishing a glow discharge zone between the shelf and the copper plate(s).

Process

The process of the invention relates to the application of a thin polymer coating system prepared by two different polymerization methods, i.e., GDP and vapor deposition polymerization. The use of an ultra-thin glow discharge polymer acts as a primary coating for the improved adhesion of the tough, thicker outer coating by vapor deposition polymerization. Specifically, an organosilane monomer which contains at least one carbon atom and no oxygen atom or a mixture of silane and a hydrocarbon is used as a precursor(s) in the glow discharge polymerization process after plasma activation (with oxygen or oxygen-rich molecules, if necessary) for the formation of strong Si—O—Si bonds between the substrate and the GDP. By selecting this gas from the silane groups, various chemical functionalities (e.g., nitrogen- or halogen-containing functionalities) can be incorporated into the precursor coating, allowing for a greater ability to match the surface chemistry of both the substrate to be coated and the final vapor deposition coating such as PPX.

According to the present invention, all of the steps of the above-described process are conducted within a vacuum chamber at pressures ranging from 0.005 to 0.5 torr. Further, these steps are preferably carried out sequentially without exposing the substrates to ambient atmosphere, thus increasing the likelihood of forming strong chemical bonds interfacially.

As the first step, the substrates are placed in the vacuum polymerization chamber and the air within is evacuated.

After a suitable residual pressure has been obtained (0.005 to 0.5 torr), the surfaces are usually cleaned and/or activated with either inert gas or reactive gas plasma, if necessary. In the case of the inert gas, argon, helium, xenon, neon, or krypton may be used. In the case of the reactive gas, the choice of gas will depend upon the chemistry of the substrate. For example, in the case of a silicon substrate, a brief activation with oxygen will form stable SiO₂ sites on the surface, which can act as bonding sites for the subsequent of glow discharge polymerization of the above-described organosilane monomers or silanehydrocarbon mixtures.

After the surfaces are activated, the desired gas or gases are introduced into the polymerization chamber. Again the selection of the specific gas will be dictated by the chemistry of the substrate. For example, silicon substrates are able to form strong bonds with polymers formed from a vaporizable organosilane monomer which contains at least one carbon atom and no oxygen atom, such as trimethylsilane. Vaporizable organosilane monomers other than trimethylsilane can also be used (see those listed in "Summary of the Invention" above). Alternatively, one can form polymers from a mixture of silane and a vaporizable hydrocarbon monomer, such as methane, ethane, propane, ethylene, or propylene. The polymers produced by glow discharge polymerization of these gases will exhibit a high degree of functional radicals from the functional family selected. Note that the precursor gases selected do not contain any oxygen, as this would be deleterious to the adhesion of the vapor deposition coating to the GDP.

It is a preferred feature of this invention that oxygen or oxygen-rich molecules, such as $CO_2$, $CO$, $NO_2$, $N_2O$, $NO$, $SO_3$, or $SO_2$, be used at the surface of an inorganic substrate to provide bonding sites for the GDP. The selection of the GDP monomer depends upon its ability to form chemical bonds with these oxygen-rich surfaces and to form similar bonds with the subsequent vapor deposition coating. Others have shown that the presence of oxygen on the surface of within the polymerization chamber during vapor deposition will degrade coating adhesion and coating quality. The present invention utilizes the ability of the above-described organosilane monomers or silane/hydrocarbon mixtures to form strong chemical bonds with oxygen, trapping the oxygen at the interface of the GDP and the substrate. With the oxygen thus trapped, a sufficiently thick layer of GDP can cover any surface oxygen sites so that they no longer pose a threat to the quality or adhesion properties of the vapor deposition coating, e.g., PPX.

Additionally, the crosslinking density of the GDP can be modulated by varying the power input to the glow discharge, or the pressure of the precursor gas(es), or both. See Yasuda *Plasma Polymerization*, pp. 149–154, Academic Press, New York, N.Y. (1985); and *Plasma Deposition, Treatment, and Etching of Polymers*, pp. 219–221, Ed. d'Agostino, Academic Press, New York, N.Y. (1990), both of which are hereby incorporated by reference. In this way, the crosslinking density of the GDP can be reduced gradually as it is deposited, reducing the stresses that might otherwise be present at the interface between the GDP and the vapor deposition coating. For example, a programmable power supply can be used such that the power applied can be ramped down from a relatively high level to a low level in a linear fashion. Similarly, other types of power controls and power curves can be used with effective results.

Organic substrates offer more opportunity for adhesion of the GDP without the use of surface oxygen. Usually excellent interfacial adhesion can be effected by an inert gas plasma activation of the substrate surface prior to GDP deposition. In fact, the presence of oxygen on the surface of a polymer will cause it to become hydrophilic. This can provide a capillary path when the coated devices are exposed to moisture, resulting in interfacial adhesive failure. Again, the above-described organosilane monomers or silane-hydrocarbon mixtures can act to negate this hydrophilic effect by forming GDP's which are hydrophobic despite their oxygen content.

The above-described process can be conveniently performed in an apparatus such as that depicted in FIG. 1. A vapor deposition polymerization precursor 44, such as p-xylylene dimer, is placed in a boat 46 within the sublimation housing 40 as shown in the Figure. The removable sublimation heater 42 does not have to be installed at this time. Substrates 28a, 28b and 28c to be coated are placed on the shelves 24a, 24b and 24c in the polymerization chamber 20. With the chamber lid 33 installed and all gas valves 29 and 31 closed, the entire system is evacuated to a pressure of approximately 15 millitorr. During this time, all of the heaters 42 and 62 are allowed to reach their respective preset temperatures.

After all heater temperatures have stabilized and a good working vacuum has been obtained, the plasma process can begin. If the substrates 28a, 28b and 28c are to be treated with a reactive or inert gas prior to deposition, the appropriate gas is introduced via the inlet tube 23. Gas flow is usually controlled by a precision instrument such as a mass flow controller. The gas passes through the central gas diffuser tube 22 and flows into the polymerization chamber 20. When the desired gas flow and chamber pressure have been obtained, a plasma is excited within the polymerization chamber 20, preferably via the application of RF power, e.g., 13.56 Mhz, to the external conductor 38. The electrical energy is coupled from the diffuser tube 22 to the shelf 24b, which is connected to a hub 26a made from a conducting material. By contrast, the hubs 26a and 26c are made of an insulating material. Thus, a highly uniform glow discharge zone is formed between the shelves 24a and 24b, as well as between the shelves 24b and 24c.

After the initial plasma cleaning or treatment, the desired plasma gas or gases are introduced to the polymerization chamber 20 in the same manner as for the cleaning or treating gas. In most cases, it is advantageous to begin the plasma polymerization process without interrupting the existing plasma field. This of course requires the modification of the applied power, system pressure and gas flow in order to obtain high quality plasma polymers. If desired, at this point in the process the sublimation heater 42 can be installed over the sublimation housing 40. Due to the low thermal conductivity of the tube and the vacuum within, a lag between the plasma polymer deposition and the vapor deposition exists if the heater is installed at a later time.

The plasma polymerization process continues until the desired polymer coating thickness has been obtained. During the last few minutes of the plasma process, the power level to the polymerization chamber 20 is gradually reduced so that the crosslinking density of the polymer coating decreases. The plasma is allowed to self-extinguish, whereupon the power and the gas flow are shut off.

The remainder of the coating process is essentially identical to the one widely practiced in the industry for vapor deposition coating. The vapor deposition polymerization precursor sublimes within the sublimation housing 40 and is drawn into the pyrolysis housing 60, where pyrolysis of the sublimed precursor occurs due to the intense heat. The energized precursor molecules continue on to the deposition chamber, where collisions with the ambient temperature of the substrates and the chamber walls cause them to lose energy and be deposited onto the surfaces of the substrates. These surfaces, having recently been covered by the plasma polymer, contain free radicals formed during the plasma process. The activity of these free radicals is what provides the enhanced chemical bonding between the glow discharge polymer and the vapor deposition coating.

Vapor deposition polymerization precursors which can be used in the process of the invention include, but are not limited to, aromatic hydrocarbons, substituted aromatic hydrocarbons, unsaturated hydrocarbons and substituted unsaturated hydrocarbons. The most preferred aromatic hydrocarbons and substituted aromatic hydrocarbons are parylenes.

Parylene is a common name that is used to designate a series of polymers synthesized by the pyrolytic, vapor-decomposition polymerization of p-xylylene dimers. See U.S. Pat. Nos. 3,221,068; 3,288,728; and 3,342,754, hereby incorporated by reference. The polymer formed from an unsubstituted dimer is referred to as parylene N or simply parylene. One formed from a dichloro-di-p-xylylene dimer is parylene C, and one formed from a tetrachloro-di-p-xylylene dimer is parylene D, and so on. Although parylene C is used in the following three illustrative examples of the process of this invention, use of any other substituted aromatic hydrocarbons (or aromatic hydrocarbons, heterocyclic compounds, or acetylenic compounds) under modified conditions is also within the present invention. Similarly, use of trimethylsilane in the following examples is also illustrative and by no means limiting the scope of the polymerization process of the present invention.

EXAMPLE I

An patterned silicon wafer is cut into pieces approximately 15 mm square. One of these pieces is clamped on a corner and the clamp is suspended from the underside of the top shelf in the apparatus of the Figure. After loading with 30 grams of p-xylylene dimer (Parylene C, Union Carbide), the apparatus is evacuated to a pressure of 12 millitorr, and all of the heaters are raised to preset temperatures and allowed to stabilize.

Argon gas is introduced at a flow rate of 17.5 cc/min until the system pressure stabilizes at 55 millitorr. A plasma cleaning/activation is performed in the chamber at the following conditions:

| pressure | 55 millitorr |
| power | 120 watts |
| flow rate | 17.5 cc/minute |
| duration | 5 minutes |

Immediately after this step, the argon flow is switched off and trimethlysilane ($[CH_3]_3SiH$) gas is introduced into the chamber. The gas flow and power are adjusted to obtain the following conditions:

| pressure | 55 millitorr |
| power | 80 watts |
| duration | 10 minutes |

At this point in the process the sublimation heater is installed over the pyrolysis tube to begin heating the dimer. Subsequent to this step the RF power is decreased over a five minute period in a linear fashion from 80 watts to 0 watts. Upon completion of this step the parylene coating process is allowed to run normally with the following conditions:

| Sublimation heater temperature | 105° C. |
| Pyrolysis heater temperature | 700° C. |
| Duration | 3 hours |

EXAMPLE II

Cardiac pacemaker assemblies encased in titanium alloy envelopes are suspended from the upper shelf of the apparatus in the Figure by means of stainless steel wires. Some portions of the pacemaker devices are masked to enable the coating to be removed later, exposition a portion of the titanium alloy surface. As in the previous example, the system is loaded with 30 grams of p-xylylene dimer (Parylene C, Union Carbide), the apparatus is evacuated to a pressure of 15 millitorr, and all of the heaters are raised to preset temperatures and allowed to stabilize.

Oxygen gas is introduced at a flow rate of 48.3 cc/min until the system pressure stabilizes at 100 millitorr. A plasma cleaning/activation is performed in the chamber at the following conditions:

| pressure | 100 millitorr |
| power | 150 watts |
| flow rate | 48.3 cc/minute |
| duration | 5 minutes |

Immediately after this step, the oxygen flow is switched off and trimethlysilane ($[CH_3]_3SiH$) gas is introduced into the chamber. The gas flow and power are adjusted to obtain the following conditions:

| pressure | 62 millitorr |
| power | 60 watts |
| duration | 25 minutes |

At this point in the process the sublimation heater is installed over the pyrolysis tube to begin heating the dimer. During the last 5 minutes of this step the RF power is decreased in a linear fashion from 60 watts to 0 watts. Upon completion of this step the parylene coating process is allowed to run normally with the following conditions:

| Sublimation heater temperature | 105° C. |
| Pyrolysis heater temperature | 700° C. |
| Duration | 3 hours |

Example III

Sensors made of polyvinylidene fluoride (PVDF) polymer are placed in the deposition chamber for coating. The polymeric surfaces are first activated using an inert gas (argon) plasma and subsequently coated with a plasma polymer and parylene.

Activate surfaces:
   Argon at 15.0 cc/min
   50 microns pressure
   100 watts
   5 minutes
Plasma polymer deposition:

Trimethylsilane at 13.0 cc/min
50 microns pressure
80 watts
10 minutes

The sublimation heater is installed and the RF power decreased from 80 to zero watts over a period of 5 minutes. Parylene coating is deposited by the same conditions as described in Example II above.

The coating produced by the process described in Example I was tested in boiling Ringer's solution until failure (film lift-off). Control samples produced without adhesion promotion and with the methane plasma polymer method described by Sharma et al. were also evaluated. The silane polymer coated samples demonstrated greatly enhanced performance in an aqueous electrolytic solution. More specifically, an interfacial adhesion seven times that of the methane-parylene method described by Sharma et al. was exhibited. For both the methane-parylene method and the test method, see Sharma et al. J. Vac. Sci. Technol. 21(4):994–998 (1982).

OTHER EMBODIMENTS

The foregoing description has been limited to specific embodiments of this invention. It will be apparent, however, that variations and modifications may be made to the invention, with the attainment of some or all of the advantages of the invention.

Other embodiments are within the following claims.

What is claimed is:

1. A process for depositing polymeric materials on the surface of a substrate, which process comprises the steps of:
   providing a first polymeric material on the surface of said substrate by glow discharge polymerization of a mixture of silane and a vaporizable hydrocarbon monomer or a vaporizable organosilane monomer which contains at least one carbon atom and no oxygen atom; and
   providing a second polymeric material on said first polymeric material by vapor deposition polymerization of an aromatic hydrocarbon, a substituted aromatic hydrocarbon, an unsaturated hydrocarbon, or a substituted unsaturated hydrocarbon.

2. The process of claim 1, further comprising the step of glow discharge activating the surface of said substrate, before providing said first polymeric material thereon, with oxygen or an oxygen-rich molecule selected from the group consisting of $CO_2$, $NO_2$, CO, $NO_2$, $N_2O$, NO, $SO_3$ and $SO_2$.

3. The process of claim 1, in the first step the crosslinking density of said first polymeric material is controlled by varying input power or monomer pressure of said glow discharge polymerization.

4. The process of claim 1, wherein said first polymeric material is provided by glow discharge polymerization of a vaporizable organosilane monomer which contains at least one carbon atom and no oxygen atom.

5. The process of claim 4, wherein said aromatic hydrocarbon or substituted aromatic hydrocarbon is p-xylylene or a substituted p-xylylene.

6. The process of claim 4, wherein said unsaturated hydrocarbon or substituted unsaturated hydrocarbon is an acetylenic hydrocarbon.

7. The process of claim 1, wherein said first polymeric material is provided by glow discharge polymerization of a mixture of silane and a vaporizable hydrocarbon monomer selected from the group consisting of methane, ethane, propane, ethylene and propylene.

8. The process of claim 1, wherein said aromatic hydrocarbon or substituted aromatic hydrocarbon is p-xylylene or a substituted p-xylylene.

9. The process of claim 1, wherein said unsaturated hydrocarbon or substituted unsaturated hydrocarbon is an acetylenic hydrocarbon.

10. A substrate coated with a composition, said composition comprising a first polymeric material on said substrate and a second polymeric material on said first polymeric material, said first polymeric material being produced by glow discharge polymerization of a mixture of silane and a vaporizable hydrocarbon monomer or a vaporizable organosilane monomer which contains at least one carbon atom and no oxygen atom, and said second polymeric material being produced by vapor deposition polymerization of an aromatic hydrocarbon, a substituted aromatic hydrocarbon, an unsaturated hydrocarbon, or a substituted unsaturated hydrocarbon.

11. The substrate of claim 10, wherein said first polymeric material is provided by glow discharge polymerization of a vaporizable organosilane monomer which contains at least one carbon atom and no oxygen atom.

12. The substrate of claim 11, wherein said aromatic hydrocarbon or substituted aromatic hydrocarbon is p-xylylene or a substituted p-xylylene.

13. The substrate of claim 11, wherein said unsaturated hydrocarbon or substituted unsaturated hydrocarbon is an acetylenic hydrocarbon.

14. The substrate of claim 10, wherein said first polymeric material is provided by glow discharge polymerization of a mixture of silane and a vaporizable hydrocarbon monomer selected from the group consisting of methane, ethane, propane, ethylene and propylene.

* * * * *